Figure 1:
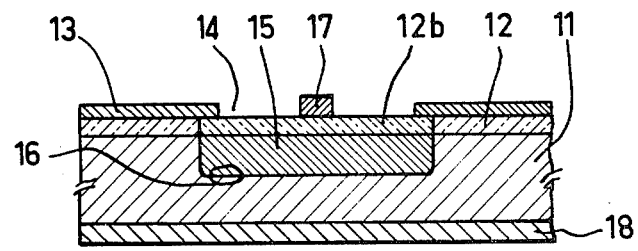

United States Patent [19]

Lebailly

[11] 4,207,586
[45] Jun. 10, 1980

[54] SEMICONDUCTOR DEVICE HAVING A PASSIVATING LAYER

[75] Inventor: Jacques Lebailly, Caen, France

[73] Assignee: U.S. Philips Corporation, New York, N.Y.

[21] Appl. No.: 864,331

[22] Filed: Dec. 27, 1977

[30] Foreign Application Priority Data

Dec. 31, 1976 [FR] France ................. 76 39706

[51] Int. Cl.² ............................................. H01L 29/34
[52] U.S. Cl. .................................. 357/52; 357/16; 357/54; 357/59
[58] Field of Search ................. 357/16, 54, 17, 59, 357/52

[56] References Cited

U.S. PATENT DOCUMENTS

| | | | |
|---|---|---|---|
| 3,723,201 | 3/1973 | Keil | 357/59 |
| 3,783,351 | 1/1974 | Tsukada et al. | 357/17 |
| 3,997,907 | 12/1976 | Nakamura et al. | 357/59 |
| 4,062,034 | 12/1977 | Matsushita et al. | 357/59 |
| 4,114,254 | 9/1978 | Aoki et al. | 357/59 |
| 4,121,238 | 10/1978 | Bachmann et al. | 357/59 |

FOREIGN PATENT DOCUMENTS

| | | | |
|---|---|---|---|
| 954915 | 4/1964 | United Kingdom | 357/52 |
| 1111991 | 5/1968 | United Kingdom | 357/52 |

Primary Examiner—Joseph E. Clawson, Jr.
Attorney, Agent, or Firm—Thomas A. Briody; Jack Oisher; Steven R. Biren

[57] ABSTRACT

A semiconductor device includes a passivating layer to reduce and stabilize the surface recombination rate. The passivating layer is of polycrystalline semiconductor material and is of the same conductivity type as that of the underlying semiconductor material. The semiconductor material of the passivating layer differs from that of the underlying semiconductor layer and has a larger energy gap than the underlying layer.

11 Claims, 4 Drawing Figures

SEMICONDUCTOR DEVICE HAVING A PASSIVATING LAYER

The invention relates to a semiconductor device having a monocrystalline semiconductor body of a first semiconductor material having a surface-adjoining first semiconductor region of a first conductivity type forming, with a likewise surface-adjoining second semiconductor region of the second conductivity type, a p-n junction terminating at the surface, the first semiconductor region being covered at least partly at the surface with a passivating layer of polycrystalline semiconductor material.

A device of the kind described is disclosed in Netherlands patent application No. 7,604,699.

In semiconductor technology, several methods are used to passivate semiconductor surfaces. The best known of these methods is the coating of the semiconductor surface with a layer of electrically insulating material, for example a silicon oxide layer. This method is used in particular in devices of the planar type.

However, this method of passivating has several disadvantages. For example, dielectric insulation layers of silicon oxide often comprise charges, in particular in the form of alkali ions. Said charges may vary the field strength at the surface and charges can also move along the dielectric layer. All this may give rise to instabilities. One prior art method of overcoming these disadvantages is to use several layers situated one on top of the other. However, this renders the provision of such passivating layers complicated.

Furthermore, the prior art method of passivating is less effective when the semiconductor material to be passivated is not silicon but, for example, a semiconductor III–V compound. The recombination rate at the surface in that case proves to be reduced only slightly as compared with the uncovered semiconductor surface, and hysteresis phenomena often occur when the electric field across the p-n junction is varied.

In Netherlands Patent Application No. 7604699 a passivating method is disclosed in which a polycrystalline semi-insulating layer, for example a polycrystalline silicon layer having a high resistivity covered with an insulating layer, is provided on a semiconductor substrate. Dependent upon the materials used, this method has several disadvantages. For example, it is difficult to give the polycrystalline layer a resistance value which on the one hand is sufficiently reproducible and on the other hand is sufficiently high to avoid undesired high leakage currents and is sufficiently low to drain surface charges, if any.

One of the objects of the invention is to avoid these disadvantages occurring in known passivating methods or at least to reduce them to a considerable extent. Another object of the invention is to realize a passivating layer in which ion charges at the surface can be drained, which layer can be provided in a reproducible manner, and which considerably reduces the surface recombination.

The invention is inter alia based on the recognition of the fact that this can be achieved by a particular choice of material properties and dopings.

For that purpose, according to the invention a semiconductor device of the kind mentioned above is characterized in that the passivating layer is of the first conductivity type and consists of a second semiconductor material which differs from the first and has a larger energy gap than the first semiconductor material.

The operation of the device according to the invention is as follows. At the interface between the first and the second semiconductor material of the same conductivity type there is present a potential barrier by which minority charge carriers are prevented from penetrating from the first material into the second material with larger energy gap. The recombination rate at the surface of the first region is considerably reduced and substantially independent of the ambient conditions.

In the device according to the invention the passivating layer is polycrystalline, in which the grain size of the polycrystalline layer may be very different. In certain circumstances the passivating layer may even be amorphous and in this Application the term polycrystalline layer should therefore be understood to include also amorphous layers. In these circumstances there is a great freedom of choice as regards the materials to be used. Both the semiconductor body and the passivating layer may consist of elementary semiconductors, of semiconductor compounds or of semiconductor solid solutions, in which the crystal lattice of the semiconductor body and that of the material of the passivating layer may differ considerably from each other since the passivating layer is polycrystalline. It may be considered to be surprising that such a boundary between a monocrystalline substrate and a polycrystalline passivating layer, in spite of the occurring structural imperfections, nevertheless results in a very low recombination rate and in a large insensitivity to the ambient conditions.

In order to obtain an optimum barrier effect, it has been found desirable for the energy gap of the second semiconductor material to be at least 0.08 eV larger than that of the first material, although smaller differences in energy gap also give a noticeably favorable effect.

According to a further preferred embodiment the doping concentration of the passivating layer is substantially equal to the doping concentration of the first region near the surface. This preferred embodiment results in optimum benefit from the barrier for the minority charge carriers of the first regions formed by the junction. Advantageously, the passivating layer and the first regions are doped with the same dopant, which simplifies the manufacturing process.

According to another preferred embodiment the passivating layer extends, as well as on the first region, also partly on the second region, said part of the passivating layer showing the second conductivity type.

Another technologically attractive preferred embodiment is characterized in that a part of the passivating layer extends on the second region, said part of the passivating layer showing the second conductivity type.

Figure 2:
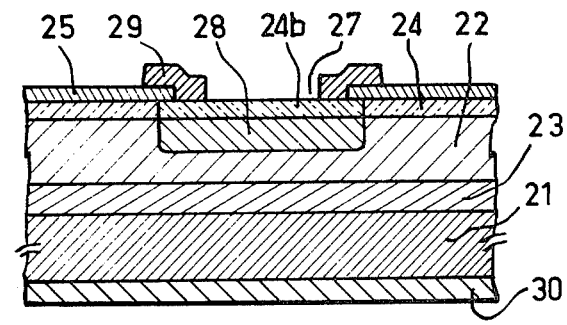
Figure 3:
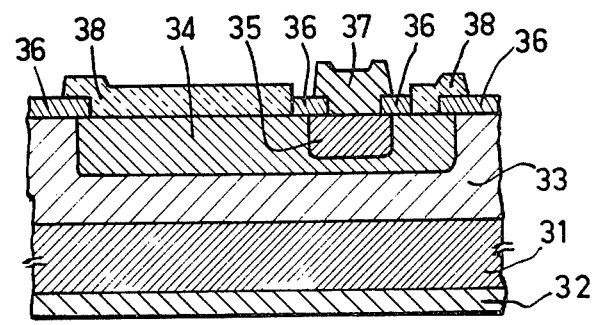
Figure 4:
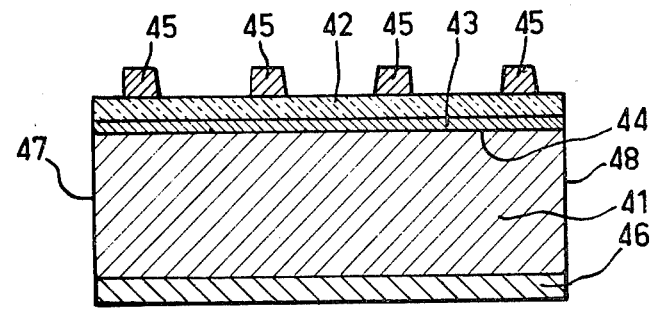

The invention will now be described in greater detail, by way of example, with reference to the accompanying drawing, in which, FIG. 1 is a diagrammatic sectional view of an electroluminescent diode according to the invention, FIG. 2 is a diagrammatic sectional view of a photodiode according to the invention, FIG. 3 is a diagrammatic sectional view of a phototransistor according to the invention, and FIG. 4 is a diagrammatic sectional view of a photovoltaic generator according to the invention.

FIG. 1 shows an electroluminescent diode of gallium arsenide. The substrate 11 is an n-type conductive gallium arsenide plate having a doping concentration of approximately $10^{17}$ atoms per cm$^3$. The substrate 11 is covered with an n-type conductive layer 12 of polycrystalline gallium phosphide (GaP) in a thickness of approximately 1.5 μm, and a sulphur doping of approximately $10^{16}$ atoms per cm$^3$.

A silicon nitride mask 13 the thickness of which is 0.10 to 0.12 μm is present on the surface of the device. In the aperture 14 of the said mask, a part 12b of the layer 12 adjoins the surface and its conductivity type has been converted into p-type by an overdoping with zinc. Present below the part 12b is a likewise zinc-doped p-conductive region 15, the first region, which forms a p-n junction 16 with the n-type substrate 11, the second region. A comb-shaped metal contact is provided on the part 12b of the layer 12 within the aperture 14 of the mask 13. The said contact which is formed by vapor-deposited aluminium is shown at 17 in FIG. 1 as a cross-section of the central branch of the said contact. The device is finally completed by a metal layer 18 which contacts the substrate 11 and with which the device is soldered on a metal support, said metal layer 18 being formed, for example, by a gold-germanium alloy.

In comparison with a known device (that is a device without the passivating layer 12) the luminous efficiency in the above-described device according to the invention is increased by approximately 50%.

According to a modified embodiment, the substrate 11 of homogeneous material was replaced by a layer of gallium arsenide the conductivity properties of which are the same as those of the substrate 11, said layer of gallium arsenide being provided epitaxially on a highly doped n-type substrate, for example, from the liquid phase according to a method in which said epitaxial layer shows a thickness of 20 μm to 40 μm. In these circumstances the quality of the material in which the electroluminescence effect occurs is such that the quantum efficiency of the device approaches the value 100%, this in contrast with a quantum efficiency of only 50% when a homogeneous substrate sawn from a monocrystalline rod is used.

The device shown in FIG. 1 may be manufactured as follows.

The layer 12 is provided from the gaseous phase on the substrate 11 of gallium arsenide in which successively the reaction in the same tubular space occurs of hydrogen-diluted PCl$_3$ with a solid source of GaP at 860° C. after which the provided GaP reacts with the substrate at 770° C. The partial pressure of PCl$_3$ in hydrogen is adjusted to obtain a growth rate of approximately 0.2 μm per minute. In general it is not necessary to add a dopant during the provision of the layer, which in itself shows an n-type doping of approximately $10^{16}$ atoms per cm$^3$. The thickness of the film 12 is not critical; it may be, for example, 1.5 μm.

The next step is the provision of a silicon nitride layer in a thickness of approximately 0.1 μm on the same active surface of the plate, which occurs by chemical reaction between SiH$_4$ and NH$_3$ in nitrogen at 780° C.; this method is generally known. A photosensitive lacquer is then provided on the surface of the plate, in which lacquer the required apertures are made by photo-etching in such manner that the aperture 14 in the mask 13 of silicon nitride can be provided by photoetching in a plasma according to a known method. The plate from which the photolacquer is removed is then subjected to a zinc diffusion in which the solid source of pure zinc is heated together with the plate at 700° C. for 60 minutes. In this manner, by conversion, the p-conductivity type is obtained by diffusion of zinc in the part 12b of the layer 12 and therethrough over a depth of 3 μm in the substrate 11 of gallium arsenide to form the region 15. After vapor deposition of the contact 17 the device is assembled in known manner.

The improvement of the luminous efficiency emitted by the device described with reference to FIG. 1 is the result of the combination of two factors: according to the invention the junction between the part 12b of the layer 12 and the region 15 considerably reduces the (non-radiative) surface recombination of the minority charge carriers, in this case electrons, which are injected in the region 15, while otherwise, taking into account the said recombination reduction, it has become possible to reduce the thickness of the region 15 to a value which corresponds approximately to or is slightly smaller than the diffusion length of the charge carriers. As a result of this, the thin region 15 thus obtained is less absorbing for emitted radiation.

FIG. 2 is a cross-sectional view of a photodiode according to the invention adapted specially for receiving light signals in a wavelength of 1.06 μm. The photodiode was manufactured as follows.

A layer 22 of $Ga_{(1-y)}In_yAs$ was provided on an n-conductive substrate 21 of gallium arsenide, y being approximately uniform and equal to 17%. For that purpose, separate sources of indium and gallium were used in a gas flow containing HCl and AsH$_3$.

The provided layer 22 has a thickness of approximately 10 μm and a forbidden bandwidth (energy gap) of approximately 1.15 eV. In order to obtain a layer 22 of good crystal quality, an intermediate layer 23 of $Ga_{(1-y)}In_yAs$ was grown during the same treatment, where y varies regularly from 0% to 17% from the substrate up to the layer 22, wherein the value y is then further kept constant. The layer 22 and the intermediate layer 23 are both n-conductive and the doping concentration of the layers is as small as possible, which is realized in practice by adding no dopants to said layers. In these circumstances, the layers show a doping concentration of approximately $10^{15}$ to $10^{16}$ atoms per cm$^3$ and this value is suitable for the described application.

According to the invention, a passivating layer 24 of n-type polycrystalline gallium arsenide in a thickness of 1 μm is provided on the layer 22 from the gaseous phase at 760° C., said layer having a doping concentration of approximately $10^{15}$ atoms per cm$^3$. The layer 24 is finally covered by a mask 25 of silicon nitride the thickness of which is approximately 0.1 μm and which is provided according to the method already described with reference to the example of FIG. 1. Via an aperture 27 provided in said mask 25, a part 24b of the layer 24 and a region 28 in a thickness of approximately 1 μm was made p-type conductive by diffusion of zinc at 700° for 10 minutes. In this manner the layer 24 has the same conductivity type and substantially the same doping concentration as the underlying substrate surface across the entire surface.

The device shown in FIG. 2 is completed by an annular metal contact 29 which contacts the periphery of the part 24b of the passivating layer 24 and which obtains the desired configuration via vapor deposition of an aluminium layer and photoetching and by an alloyed metal layer 30 with which the device can be soldered to a metal support; the said layer is, for example, a vapor-deposited tin layer.

The above-described device shows a very remarkable sensitivity of 600 mA per Watt of incident radiation of wavelength 1.06 82 m, while known silicon photodiodes generally show a sensitivity only which does not exceed 400 mA per Watt.

Another application possibility of the invention will now be described with reference to FIG. 3 which is a cross-sectional view of a phototransistor. An n-conductive silicon substrate 31 having a high doping concentration is provided with a contact 32 which is formed by a layer of vapor-deposited gold on the lower surface of the said substrate 31. The surface of the substrate 31 opposite to the contact 32 is covered with an epitaxial layer 33 of n-conductive silicon the thickness of which is 15 $\mu$m to 20 $\mu$m and the resistivity of which is 2 ohm.cm to 5 ohm.cm. According to a known selective diffusion method, a p-conductive base region 34 having a thickness of 6 $\mu$m and an n+-conductive emitter region 35 having a thickness of 5 $\mu$m are successively formed. In the oxide layer 36 obtained during said operations, an aperture was provided via photoetching which exposes a large part of the base region 34 at the surface of the structure and an aperture for the emitter contact 37 formed by vapor-deposited aluminium. A passivating layer 38 is provided on the exposed part of the base region 34, while, as shown in FIG. 3, said passivating layer is separated from the collector-base junction and from the emitter-base junction by the oxide layer 36.

According to the invention the passivating layer 38 is formed by a layer of p-conductive polycrystalline gallium phosphide (GaP) whose thickness is approximately 1.5 $\mu$m and which is provided in known manner from the gaseous phase at a temperature of preferably 750° C. and is doped, for example, with zinc to a doping concentration of approximately $10^{16}$ atoms per cm$^3$.

The passivating layer 38 is brought in the desired configuration via masking by means of a photosensitive lacquer and by etching in a gas plasma according to a known method. The device is further provided with contacts by means of known methods and is assembled.

The device as described above is particularly suitable for use in combination with a light-emissive diode of gallium arsenide, which combination is known as photocoupler. The use of the invention is particularly advantageous in this combination because the passivating layer 38 shows very little absorption with respect to the radiation emitted by the light-emissive diode and reduces the surface recombination rate of the base of the phototransistor to approximately $10^3$ cm/second, which is essential to obtain a good sensitivity in the base-collector diode of the structure, the sensitivity being stable due to the impermeability of the passivating layer 38.

Compared with a phototransistor which is passivated with a layer of dielectric material, a final important advantage of the structure according to the invention is that the device according to the invention is particularly sensitive to high voltages between the light emitter and the light receiver in a photocoupler. This can be explained by the easy drainage of the ion charges which can be formed in the transparent resin separating the emitter from the receiver; these charges are attracted electrostatically at each pole of the circuit and can be removed via the base region of the phototransistor due to the fact that the passivating layer 38 is sufficiently electrically conductive. In the case of a phototransistor having a known structure and covered with a layer of dielectric material, on the contrary, the said ion charges can accumulate in the proximity of the base region and influence its potential, which explains that the surface properties of the base of said phototransistor are not stable, which is also the case with the electrical properties of the device.

FIG. 4 shows another embodiment of the invention, namely a photovoltaic generator. The device is formed by an n-conductive substrate 41 of gallium arsenide having a moderate doping concentration of approximately $5.10^{16}$ atoms per cm$^3$. On a major surface of the substrate 41 a p-conductive layer 42 of polycrystalline GaP is provided in a thickness of 3 $\mu$m, and a zinc doping of approximately $2.10^{19}$ atoms per cm$^3$.

A p-conductive active region 43 is formed in the substrate 41 by diffusion of zinc from the layer 42; the diffusion is carried out at 830° C. for 60 minutes. In these circumstances the thickness of the active region 43 thus formed is approximately 2 $\mu$m.

According to the invention, the GaAs device comprising the p-n junction 44 is thus covered with a passivating layer 42 of polycrystalline GaP which has the same conductivity type as the active region 43. The layer 42 gives rise to a small surface recombination rate of the minority electrons in the active region 43.

The device is provided with a contact in the form of a grid the elements of which, viewed in cross-section, are referred to by reference numeral 45, the said contact being formed by vapor deposition of aluminium via a mask and is provided with a contact 46 obtained by alloying at 420° C. of a layer of vapor-deposited tin. Finally the side surfaces 47 and 48 are obtained by cleavage. The device thus obtained is suitable for operation at high temperature, for example 150° C., without noticeable efficiency loss as compared with the operation at normal ambient temperature. Moreover, the device has an internal resistance which is particularly small. As a result of these properties the device described can operate at a very strong illumination level, for example, at the illumination level of sunlight which is concentrated by means of optical devices.

Although the device has been described with reference to several specific embodiments, it will be obvious that many variations are possible to those skilled in the art without departing from the scope of the invention. By way of example, applications were described for the manufacture of passivating layers of polycrystalline semiconductor material the thickness of which is approximately 1 $\mu$m, but for several applications it is possible to use thicknesses which differ considerably from this value.

In order to prevent cracks in the passivating layer as a result of the difference in coefficients of expansion with the substrate, the passivating layer has a thickness of at least 0.02 $\mu$m and at most 5 $\mu$m and preferably from at least 0.1 $\mu$m to at most 2 $\mu$m.

A particular characteristic feature of the passivating layer according to the invention is that in contract with the known passivating layers of dielectric material, the passivating layer according to the invention is electrically conductive. So in certain circumstances it is advantageous to contact the first active region of the device by providing an electrode layer on the passivating layer. This means a considerable simplification of the manufacture of the device. The effect of the reduction of the surface recombination is larger as the difference in energy gap between the substrate and the passivating layer is larger. The said difference is, for example, at least 80 milli-electron volts.

For realizing the invention it is possible to use a variety of semiconductor bodies. Intermetallic III–V or II–VI compounds as a material for the formation of the passivating layer and/or of the substrate are used, provided the difference in energy gap fulfils the conditions of the invention. For example, a ZnS passivating layer on silicon or on ZnTe, or an InP passivating layer on InAs, or a GaSb layer on InSb may be provided. Finally, the choise of the materials may also be extended to solid solutions in varied ratios and to ternary intermetallic compounds.

What is claimed is:

1. A semiconductor device having a monocrystalline semiconductor body of a first semiconductor material having a surface-adjoining first semiconductor region of a first conductivity type, a second semiconductor region of the second conductivity type, and a p-n junction formed between said first and second regions, the first semiconductor region being covered at least partly at its surface with a passivating layer of polycrystalline semiconductor material of the first conductivity type and comprising a second semiconductor material which differs from the first semiconductor material and which has a larger energy gap than the first material.

2. A semiconductor device as claimed in claim 1, wherein the energy gap of the second semiconductor material is at least 0.08 eV larger than that of the first material.

3. A semiconductor device as claimed in claim 1, wherein the doping concentration of the passivating layer is substantially equal to the doping concentration of the first region near its surface.

4. A semiconductor device as claimed in claim 3, wherein the passivating layer and the first region are doped with the same dopant.

5. A semiconductor device as claimed in claim 1, wherein said second region adjoins said surface and said p-n junction terminates at said surface, and a part of the passivating layer extends on the second region, said part of the passivating layer being of the second conductivity type.

6. A semiconductor device as claimed in claim 1, wherein the passivating layer has a thickness of at least 0.02 micron and at most 5 microns.

7. A semiconductor device as claimed in claim 6, wherein the passivating layer has a thickness of at least 0.1 micron and at most 2 microns.

8. A semiconductor device as claimed in claim 1, wherein minority charge carriers are injected in the first region.

9. A semiconductor device as claimed in claim 1, wherein an electrode layer is provided on the passivating layer to contact the first region.

10. A semiconductor device as claimed in claim 1, wherein the first region is an active zone of an electroluminescent diode.

11. A semiconductor device as claimed in claim 1, wherein the first region is an active zone of a radiation-sensitive device.

* * * * *